(12) United States Patent
Choi et al.

(10) Patent No.: US 9,966,497 B2
(45) Date of Patent: May 8, 2018

(54) METHOD OF FABRICATING NONPOLAR GALLIUM NITRIDE-BASED SEMICONDUCTOR LAYER, NONPOLAR SEMICONDUCTOR DEVICE, AND METHOD OF FABRICATING THE SAME

(71) Applicant: Seoul Viosys Co., Ltd., Ansan-si (KR)

(72) Inventors: Seung Kyu Choi, Ansan-si (KR); Chae Hon Kim, Ansan-si (KR); Jung Whan Jung, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days. days.

(21) Appl. No.: 14/708,044

(22) Filed: May 8, 2015

(65) Prior Publication Data
US 2015/0270435 A1 Sep. 24, 2015

Related U.S. Application Data

(63) Continuation of application No. 13/848,352, filed on Mar. 21, 2013, now Pat. No. 9,076,896.

(30) Foreign Application Priority Data

Mar. 21, 2012 (KR) .................. 10-2012-0028589
Mar. 23, 2012 (KR) .................. 10-2012-0029906

(51) Int. Cl.
*H01L 33/00* (2010.01)
*H01L 33/12* (2010.01)
(Continued)

(52) U.S. Cl.
CPC ...... *H01L 33/0075* (2013.01); *H01L 33/0062* (2013.01); *H01L 33/04* (2013.01);
(Continued)

(58) Field of Classification Search
CPC .......... H01L 31/03044; H01L 31/1856; H01L 2924/1033; H01L 33/0075; H01L 33/0062;
(Continued)

(56) References Cited

U.S. PATENT DOCUMENTS 6,121,656 A    9/2000  Tanaka et al.
6,288,410 B1 * 9/2001  Miyazawa ............ B82Y 20/00
                                                              257/14
(Continued)

FOREIGN PATENT DOCUMENTS

CN    1977366        6/2007
JP    2003-023216 A  1/2003
(Continued)

OTHER PUBLICATIONS

State Intellectual Property Office of China, Office Action, Chinese Patent Application No. 201380015737.4, dated May 5, 2016, (including English translation), 32 pages.
(Continued)

*Primary Examiner* — Benjamin Sandvik
*Assistant Examiner* — Gustavo Ramallo
(74) *Attorney, Agent, or Firm* — Perkins Coie LLP

(57) ABSTRACT

A method of fabricating a nonpolar gallium nitride-based semiconductor layer is provided. The method is a method of fabricating a nonpolar gallium nitride layer using metal organic chemical vapor deposition, and includes disposing a gallium nitride substrate with an m-plane growth surface within a chamber, raising a substrate temperature to a GaN growth temperature by heating the substrate, and growing a gallium nitride layer on the gallium nitride substrate by supplying a Ga source gas, an N source gas, and an ambient gas into the chamber at the growth temperature. The supplied ambient gas contains $N_2$ and does not contain $H_2$.

21 Claims, 7 Drawing Sheets

(51) Int. Cl.
*H01L 33/32* (2010.01)
*H01L 33/04* (2010.01)
*H01L 33/16* (2010.01)

(52) U.S. Cl.
CPC .............. *H01L 33/12* (2013.01); *H01L 33/32* (2013.01); *H01L 33/16* (2013.01); *H01L 2933/0025* (2013.01)

(58) Field of Classification Search
CPC ......... H01L 33/04; H01L 33/12; H01L 33/32; H01L 33/16
See application file for complete search history.

(56) References Cited

U.S. PATENT DOCUMENTS

| | | | |
|---|---|---|---|
| 6,504,171 B1* | 1/2003 | Grillot | B82Y 20/00 257/13 |
| 7,732,301 B1 | 6/2010 | Pinnington et al. | |
| 8,097,481 B2 | 1/2012 | Imer et al. | |
| 8,148,713 B2 | 4/2012 | Sato et al. | |
| 8,193,079 B2 | 6/2012 | Kaeding et al. | |
| 2001/0016404 A1* | 8/2001 | Hayakawa | B82Y 20/00 438/496 |
| 2008/0164489 A1* | 7/2008 | Schmidt | B82Y 20/00 257/102 |
| 2009/0189190 A1 | 7/2009 | Hashimoto et al. | |
| 2009/0268768 A1* | 10/2009 | Ueno | B82Y 20/00 372/43.01 |
| 2009/0310640 A1 | 12/2009 | Sato et al. | |
| 2010/0213439 A1* | 8/2010 | Ueno | B82Y 20/00 257/13 |
| 2014/0103292 A1 | 4/2014 | Yoshida et al. | |

FOREIGN PATENT DOCUMENTS

| | | |
|---|---|---|
| TW | 200833885 | 8/2008 |
| WO | 2010011201 A1 | 1/2010 |
| WO | 2010150809 A1 | 12/2010 |

OTHER PUBLICATIONS

Second Office Action (Translation and Original) received from the State Intellectual Property Office of People's Republic of China for Application No. 201380015737.4, dated Dec. 13, 2016, 18 pages.
Office Action in Korean Patent Application No. 10-2012-0028589, dated Dec. 28, 2017.

* cited by examiner

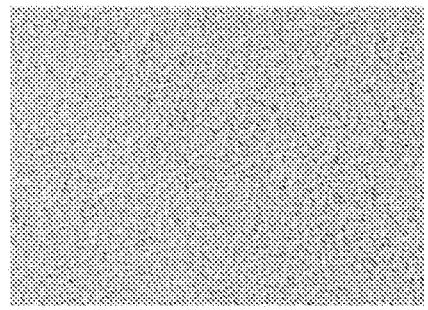
800°C Fig. 5(a)
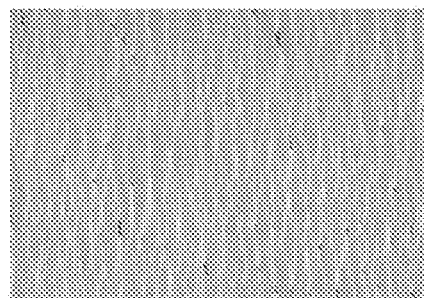
1050°C Fig. 5(d)
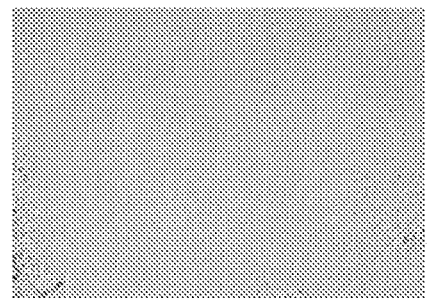
900°C Fig. 5(b)
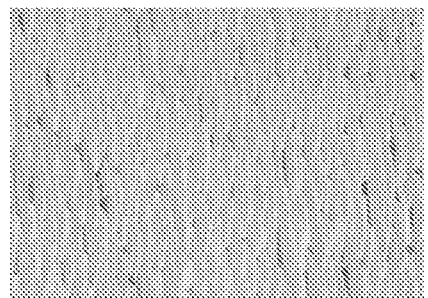
1100°C Fig. 5(e)
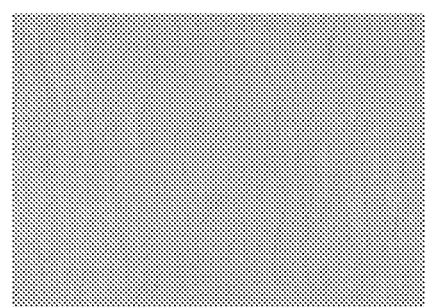
1000°C Fig. 5(c)
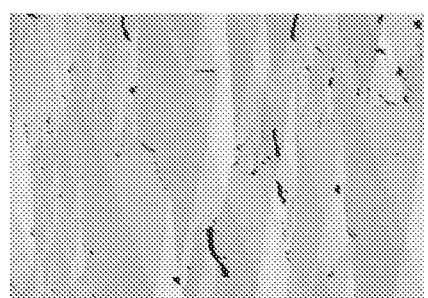
1150°C Fig. 5(f)

n SIDE ← → p SIDE

METHOD OF FABRICATING NONPOLAR GALLIUM NITRIDE-BASED SEMICONDUCTOR LAYER, NONPOLAR SEMICONDUCTOR DEVICE, AND METHOD OF FABRICATING THE SAME

CROSS-REFERENCE TO RELATED APPLICATIONS

This application is a continuation of, and claims the benefits and priority to U.S. patent application Ser. No. 13/848,352, filed on Mar. 21, 2013, and claims the benefits and priorities of Korean Patent Application No. 10-2012-0028589, filed on Mar. 21, 2012, and Korean Patent Application No. 10-2012-0029906, filed on Mar. 23, 2012, which are hereby incorporated by reference for all purposes as if fully set forth herein.

BACKGROUND OF THE INVENTION

Field of the Invention

Exemplary embodiments of the present invention relate to a gallium nitride-based semiconductor device, and more particularly, to a method of fabricating a nonpolar gallium nitride-based semiconductor layer, a nonpolar semiconductor device, and a method of fabricating the same.

Discussion of the Background

Gallium nitride-based compounds are recognized as important materials for high-power high-performance optical devices or electronic devices. In particular, since group-III nitrides, such as GaN, have excellent thermal stability and a direct transition energy band structure, group-III nitrides have recently attracted much attention as materials for light emitting devices of a visible ray region and an ultraviolet ray region. For example, blue and green light emitting devices using InGaN have been utilized in a variety of applications, for example, large-sized natural-color flat panel display devices, traffic lights, indoor illumination, high-density light sources, high-resolution output systems, and optical communications.

However, since if is difficult to fabricate homogenous substrates capable of growing the group-III nitride semiconductor layers thereon, group-III nitride semiconductor layers have been grown on heterogeneous substrates having a similar crystal structure through metal organic chemical vapor deposition (MOCVD). As the heterogeneous substrates, sapphire substrates with a hexagonal structure have been mainly used. In particular, since GaN epitaxial layers tend to be grown with a c-plane orientation, sapphire substrates with a c-plane growth surface have been mainly used.

However, an epitaxial layer grown on a heterogeneous substrate has a relatively high dislocation density due to lattice mismatch and thermal expansion coefficient difference with respect to a growth substrate. It is known that an epitaxial layer grown on a sapphire substrate generally has a dislocation density of $IE8/cm^2$ or more. Such an epitaxial layer having a high dislocation density has a limit to improving the luminous efficiency of light emitting diodes.

Furthermore, a c-plane gallium nitride-based semiconductor layer grown on a c-plane growth surface generates an internal electric field due to spontaneous polarization and piezoelectric polarization, which reduces a radiative recombination rate. In order to prevent such polarization phenomenon, research into nonpolar or semipolar gallium nitride-based semiconductor layers is in progress. As one of such research, attempts have been made to form a gallium nitride layer using a nonpolar or semipolar gallium nitride substrate as a growth substrate. However, in a case where a gallium nitride layer is grown on a nonpolar gallium nitride substrate using a growth method on a sapphire substrate, the gallium nitride layer has a very rough surface morphology. In a case where a semiconductor device, such as a light emitting diode, is fabricated using such a gallium nitride layer, a leakage current is large and a nonradiative recombination rate is increased, making it difficult to obtain excellent luminous efficiency.

SUMMARY OF THE INVENTION

Exemplary embodiments of the present invention provide a method of growing a nonpolar gallium nitride-based semiconductor layer enable of improving surface morphology of a gallium nitride-based semiconductor layer which is grown on a nonpolar gallium nitride substrate.

Exemplary embodiments of the present invention also provide a method of fabricating a semiconductor device by forming nonpolar gallium nitride-based semiconductor layers with high crystal quality on a nonpolar gallium nitride substrate.

Exemplary embodiments of the present invention also provide a semiconductor device having a nonpolar or semipolar semiconductor layer with improved crystal quality.

Exemplary embodiments of the present invention also provide a nonpolar or semipolar light emitting diode and a method for fabricating the same.

In a case where the gallium nitride layer is grown on the conventional sapphire substrate, $H_2$ or both of $H_2$ and $N_2$ are mainly used as the ambient gas. Since $H_2$ has high molecular mobility, it is advantageous to equalize the internal temperature of the chamber. Furthermore, since $H_2$ functions to clean the surface of the sapphire substrate, it is preferably used to grow the gallium nitride layer with excellent surface characteristics. However, if the gallium nitride layer is grown on the nonpolar gallium nitride substrate using the same condition as the condition of growing the gallium nitride layer on the sapphire substrate, the gallium nitride layer with a rough surface is grown. The inventors of the present application found that anisotropy on the surface of the nonpolar gallium nitride substrate affected the surface morphology, and have accomplished the present invention.

An embodiment of the present invention provides a method of fabricating a nonpolar gallium nitride layer using metal organic chemical vapor deposition. This method includes: disposing a gallium nitride substrate with an m-plane growth surface within a chamber; raising a substrate temperature to a GaN growth temperature by heating the substrate; and growing a gallium nitride layer on the gallium nitride substrate by supplying a Ga source gas, an N source gas, and an ambient gas into the chamber at the growth temperature. The supplied ambient gas contains $N_2$ and does not contain $H_2$.

$H_2$ gas etches the surface of the gallium nitride substrate. However, due to the anisotropy of the gallium nitride substrate, the surface of the gallium nitride substrate is differently etched according to directions by $H_2$ gas. In addition, since the gallium nitride layer grown on the substrate is anisotropically etched by $H_2$ gas, the gallium nitride layer is grown to have a rough surface. Therefore, according to the present invention, by cutting off the supply of $H_2$ gas used as the ambient gas, it is possible to prevent the substrate surface or the growing GaN from being etched by $H_2$ gas. Consequently, the gallium nitride layer with improved surface morphology can be fabricated.

Furthermore, $N_2$ gas alone may be supplied into the chamber as the ambient gas.

On the other hand, the Ga source gas may be TMG or TEG, and the N source gas may be $NH_3$.

The GaN growth temperature may be equal to or higher than 950° C. and lower than 1,050° C. In particular, the GaN growth temperature may be 1,000° C.

In addition, the N source gas and the ambient gas may be supplied even when the substrate temperature is being raised to the GaN growth temperature.

The Ga source gas may be supplied even when the substrate temperature is being raised. However, in order to prevent GaN from being formed at an unstable temperature, the Ga source gas may be supplied only at the GaN growth temperature. In addition, the gallium nitride substrate may be maintained for 3 to 10 minutes after the gallium nitride substrate reaches the GaN growth temperature and before the Ga source gas is supplied.

An embodiment of the present invention provides a method of fabricating a semiconductor device by using the nonpolar gallium nitride layer fabricated using the above-described method.

An embodiment of the present invention provides a semiconductor device including: a gallium nitride substrate; a gallium nitride-based first semiconductor layer disposed on the gallium nitride substrate; and an intermediate-temperature buffer layer disposed between the gallium nitride substrate and the first semiconductor layer. The intermediate-temperature buffer layer is grown on the gallium nitride substrate in a growth temperature of 700 to 800° C.

The gallium nitride substrate has a nonpolar or semipolar growth surface, and the intermediate-temperature buffer layer is directly formed on the growth surface of the gallium nitride substrate. In particular, the gallium nitride substrate may have an m-plane growth-surface, and the intermediate-temperature buffer layer may be disposed on the m-plane growth surface. On the other hand, the intermediate-temperature buffer layer may be a GaN layer.

The semiconductor device may further include: a second semiconductor layer disposed above the first semiconductor layer; and an active layer disposed between the first semiconductor layer and the second semiconductor layer. The semiconductor device may be a nonpolar or semipolar light emitting diode.

An embodiment of the present invention provides a method of fabricating a semiconductor device including: forming an intermediate-temperature buffer layer on a gallium nitride substrate in a range of 700 to 800° C.; and growing a gallium nitride-based first semiconductor layer on the intermediate-temperature buffer layer at a growth temperature higher than a formation temperature of the intermediate-temperature buffer layer.

The gallium nitride substrate may have a nonpolar or semipolar growth surface. In particular, the gallium nitride substrate may have an m-plane growth surface, and the intermediate-temperature buffer layer may be formed on the m-plane growth surface. Furthermore, the intermediate-temperature buffer layer may be formed of GaN.

The growing of the first semiconductor layer may include: stopping a supply of a gallium source after the intermediate-temperature buffer layer is formed; raising a temperature of the gallium nitride substrate to a growth temperature of the first semiconductor layer; maintaining the gallium nitride substrate at the growth temperature of the first semiconductor layer for 3 to 10 minutes; and resuming the supply of the gallium source to grow a gallium nitride-based layer on the intermediate-temperature buffer layer.

The method may further include: growing an active layer on the first semiconductor layer; and growing a gallium nitride-based second semiconductor layer on the active layer.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 5A to 5F are optical photographs snowing surface morphologies of the nonpolar gallium nitride layer according to a growth temperature.

DETAILED DESCRIPTION OF THE ILLUSTRATED EMBODIMENTS

Figure 1:
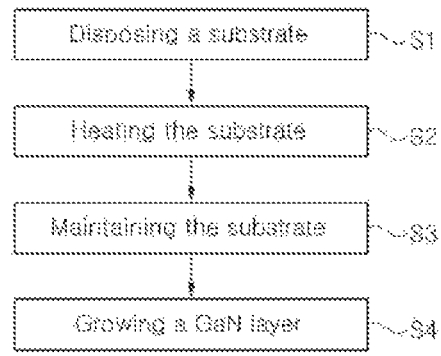
FIG. 1 is a schematic flow diagram for describing a method of fabricating a nonpolar gallium nitride layer according to an embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 2:
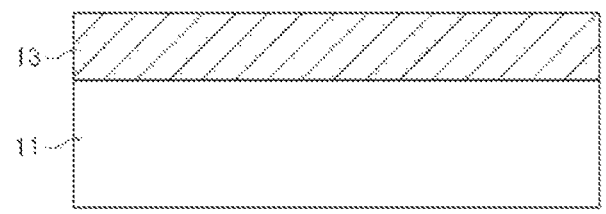
FIG. 2 is a schematic cross-sectional view for describing the method of fabricating the nonpolar gallium nitride layer according to the embodiment of the present invention.
Figure 3:
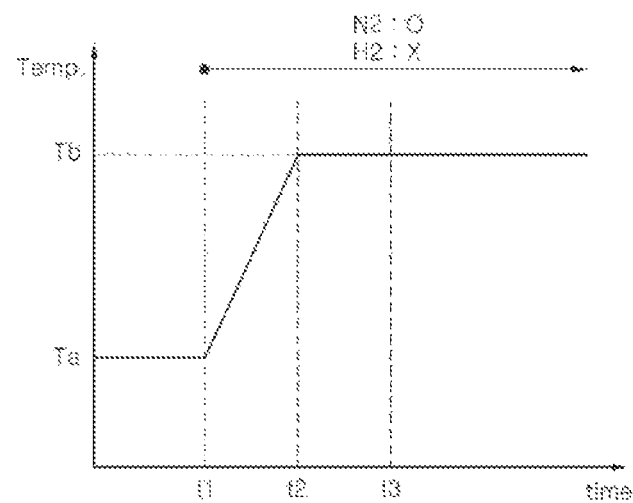
FIG. 3 is a temperature profile for describing the method of fabricating the nonpolar gallium nitride layer according to the embodiment of the present invention.

FIG. 1 is a schematic flow diagram for describing a method of fabricating a nonpolar gallium nitride layer according to an embodiment of the present invention, FIG. 2 is a schematic cross-sectional view for describing the method of fabricating the nonpolar gallium nitride layer according to the embodiment of the present invention, and FIG. 3 is a temperature profile for describing the method of fabricating the nonpolar gallium nitride layer according to the embodiment of the present invention. Ambient gas also is illustrated in FIG. 3.

Referring to FIGS. 1, 2 and 3, a nonpolar gallium nitride substrate 11 is disposed inside a MOCVD chamber (S1). In this embodiment, the nonpolar gallium nitride substrate 11 has an m-plane growth surface. In addition, the growth surface of the gallium nitride substrate 11 may have a tilt angle for assisting the growth of an epitaxial layer.

The gallium nitride substrate 11 having the m-plane growth surface may be, but is not limited to, a bare substrate fabricated using an HVPE technique or the like. The m-plane gallium nitride substrate 11 may include a gallium nitride-based semiconductor layer which is formed thereon and has an m-plane growth surface grown on the bare substrate. For example, a GaN layer or an InGaN layer may be grown on a bare-state m-plane gallium nitride substrate at a relatively low temperature, and a nonpolar gallium, nitride layer 13 according to the embodiment may be grown on the GaN layer or the InGaN layer.

The MOCVD chamber is a well-known chamber for growth of gallium nitride-based semiconductor layers. The MOCVD chamber includes a tray on winch the substrate 11 is to be disposed, and a susceptor on which the tray is positioned. The susceptor is heated by a heater, and heat from the susceptor is transferred to the substrate 11 so that the substrate 11 is heated. A temperature of the susceptor is measured by a thermocouple, and the measured temperature of the susceptor is considered as a temperature of the substrate 11. On the other hand, the MOCVD chamber includes a gas supply unit configured to supply an ambient gas (or carrier gas) such as $N_2$, $H_2$, or Ar together with a source gas of group III element such as Al, In, or Ga, an N source gas such as $NH_3$, and an impurity source gas such as $SiH_4$ or $Cp_2Mg$.

The susceptor is heated by the heater, and the heat from the susceptor is transferred so that the substrate is heated (S2). Accordingly, as illustrated in FIG. 3, the temperature of the substrate 11 rises from Ta to Tb during a period of time from t1 to t2. The temperature of the substrate 11 may rise, for example, at a rate of about 100° C./min.

$N_2$ gas may be supplied as the ambient gas during the heating of the substrate 11, and $NH_3$ may be supplied. It is preferable that $H_2$ gas is not supplied during the heating of the substrate 11. In particular, in a case where $H_2$ gas is supplied when the temperature of the substrate 11 is high, for example, above about 800° C., the surface of the substrate 11 may be etched by the gas. In this case, since the m-plane gallium nitride substrate 11 has high anisotropy, the surface etching by the $H_2$ gas appears differently depending on a direction on the surface of the substrate 11. As a result, the substrate 11 has a stripe-shaped rough surface. Therefore, it is preferable to cut off the supply of the $H_2$ gas in the process of raising the temperature of the substrate 11 so as to prevent the surface of the substrate 11 from being rough.

On the other hand, a Ga source gas may be supplied during the heating of the substrate 11, but a GaN layer may be grown on the substrate 11 by the supply of the Ga source gas. Since the GaN layer is formed in a state in which the temperature is not stabilized, the surface of the GaN layer is readily formed roughly. It is necessary to precisely control a process condition so as to grow the GaN layer with excellent surface morphology. Therefore, it is preferable that the Ga source gas is not supplied during the heating of the substrate 11 so as to achieve a stable process.

On the other hand, an $NH_3$ gas supplies nitrogen (N) to the surface of the substrate 11, which prevents nitrogen atoms from being separated from the gallium nitride substrate 11. In addition, $N_2$ as the ambient gas serves to raise the internal temperature of the chamber. Instead of $N_2$ or in addition to $N_2$, inert gas such as Ar may be supplied as the ambient gas.

Subsequently, after the temperature of the substrate 11 reaches the growth temperature Tb, the substrate 11 is maintained at the growth temperature Tb during a period of time from t2 to t3 (S3). The period of time may be, for example, 3 to 10 minutes. The growth temperature Tb may be in a range from 950° C. to 1,050° C., in particular, about 1,000° C. During this period of time, $N_2$ and $NH_3$ are continuously supplied so that the gas state inside the chamber and the surface state of the substrate 11 are stabilized. In addition, even during this period of time, $H_2$ is not supplied for the same reason as described above. Since the step S3 is required for stabilizing the process, the step S3 may be skipped.

Subsequently, a Ga source gas is supplied to the chamber, and thus, a gallium nitride layer 13 is grown on the substrate 11 (S4). The gallium nitride layer 13 is grown with an m-plane growth surface along the growth surface of the substrate 11. At this time, in a case where $H_2$ is supplied as the ambient gas, $H_2$ anisotropically etches the growing GaN. Hence, the surface of the gallium nitride layer 13 may become rough. For this reason, $H_2$ is not supplied as the ambient gas. As the ambient gas, as described above, $N_2$ may be used, or inert gas such as Ar may be used. In order to dope impurity into the gallium nitride layer 13, an impurity source gas such as $Cp_2Mg$ may be supplied together.

Experimental Example 1

Figure 4A:
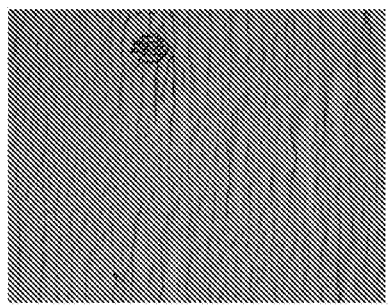
FIGS. 4A to 4C are optical photographs showing surface morphologies of the nonpolar gallium nitride layer according to kinds of ambient gas.
Figure 4B:
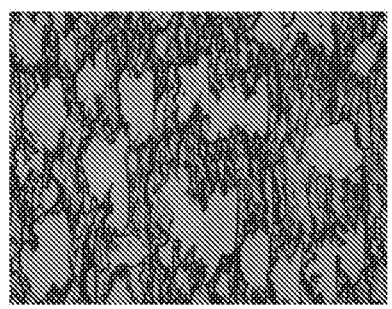
Figure 4C:
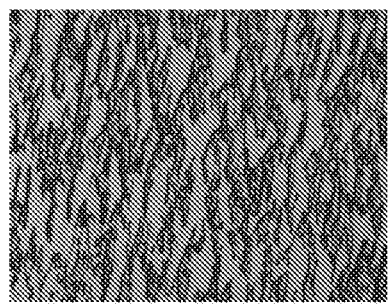

FIGS. 4A to 4C are optical photographs showing surface morphologies of the nonpolar gallium nitride layer 13 according to kinds of ambient gas. Specifically, FIG. 4A shows the case where $N_2$ is supplied as the ambient gas, FIG. 4B shows the case where $H_2$ is supplied as the ambient gas, and FIG. 4C shows the case where $N_2$ and $H_2$ are supplied together as the ambient gas. In all the cases, the gallium nitride layer was grown on the m-plane gallium nitride substrate 11 at the same growth temperature, and flow rates of source gases were adjusted appropriately to each ambient gas.

As shown in FIG. 4A, in a case where $H_2$ was not supplied and $N_2$ was supplied as the ambient gas, the gallium nitride layer 13 with relatively excellent surface morphology was grown. On the other hand, as shown in FIGS. 4B and 4C, in a case where $H_2$ was contained in the ambient gas, the surface of the gallium nitride layer was very rough. In addition, in a case where only $H_2$ was supplied, the surface of the gallium nitride layer was most rough as shown in FIG. 4B.

In a case where $H_2$ is supplied as the ambient gas, it is determined that the surface of the gallium nitride layer 13 is formed roughly because the surface of the gallium nitride substrate 11 and the gallium nitride layer are anisotropically etched by $H_2$.

FIGS. 5A to 5F are optical photographs showing surface morphologies of the nonpolar gallium nitride layer according to a growth temperature. The gallium nitride layer of each sample was grown on the m-plane gallium nitride substrate 11 under the same condition, except for a different growth temperature, and only $N_2$ gas was used as the ambient gas.

Referring to FIG. 5, the surface morphology of the gallium nitride layer 13 is greatly different according to the substrate temperature Tb. In particular, it can be seen that the gallium nitride layer with relatively excellent surface morphology was grown when the substrate temperature was 1,000° C.

Figure 6:
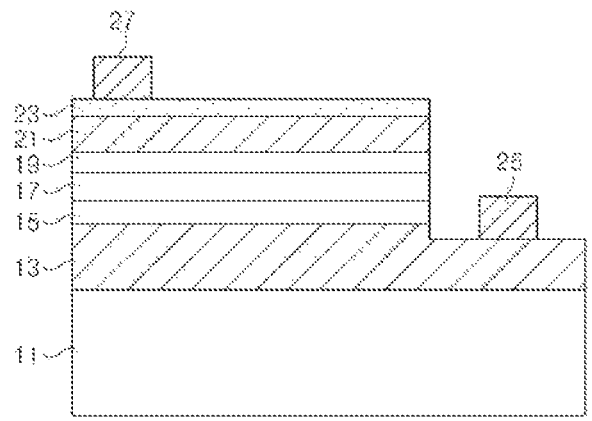
FIG. 6 is a cross-sectional view for describing a light emitting diode according to another embodiment of the present invention.

FIG. 6 is a cross-sectional view for describing a light emitting diode according to an embodiment of the present invention.

Referring to FIG. 6, the light emitting diode includes a gallium nitride substrate 11, a first contact layer 13, a superlattice layer 15, an active layer 17, a p-type clad layer 19, and a second contact layer 21. In addition, the light emitting diode may further include a transparent conductive layer 23, a first electrode 25, and a second electrode 27.

Since the gallium nitride substrate 11 is the same as described with reference to FIG. 2, the detailed description thereof will be omitted. The first contact layer 13 may be formed of Si-doped GaN. The first contact layer 13 is substantially identical to the gallium nitride layer 13 of FIG. 2, except that Si is doped as impurity. As described above with reference to FIGS. 1 to 3, the first contact layer 13 is grown on the gallium nitride substrate 11, and $N_2$ used as the ambient gas, whereas $H_2$ is not used.

The superlattice layer 15 with a multi-layered structure may be disposed on the first contact layer 13. The superlattice layer 15 is disposed between the first contact layer 13 and the active layer 17. The superlattice layer 15 may be formed by repetitively laminating a pair of InGaN/GaN at multiple periods (for example, 15 to 20 periods), but is not limited thereto. For example, the superlattice layer 15 may be configured in such a way that three-layer structure of InGaN layer/AlGaN layer/GaN layer is repetitively laminated at multiple periods (for example, 10 to 20 periods). It is preferable that $H_2$ gas is not supplied when the superlattice layer 15 is being formed.

On the other hand, the active layer 17 with a multiple quantum well structure is disposed on the superlattice layer 15. The active layer 17 has a structure in which barrier layers and well layers are alternately laminated. For example, the barrier layer may be GaN, AlGaN, or AlInGaN, and the well layer may be InGaN or GaN. The active layer 17 is grown at a relatively lower temperature than the growth temperature of the first contact layer 13, but it is preferable that $H_2$ gas is not supplied.

The p-type clad layer 19 is disposed on the active layer 17, and may be formed of AlGaN or AlInGaN. Alternatively, the p-type clad layer 19 may also be formed in a superlattice structure in which InGaN/AlGaN is repetitively laminated. The p-type clad layer 19 is an electron blocking layer and prevents electrons from moving to the p-type contact layer 21, leading to an improvement in luminous efficiency. The p-type clad layer 19 is grown at a relatively higher temperature than the growth temperature of the active layer 17. Therefore, it is necessary to raise the substrate temperature so as to grow the p-type clad layer 19. At this time, $H_2$ gas is not supplied when the substrate temperature is being raised. In addition, $H_2$ gas is not also supplied when the p-type clad layer 19 is being grown.

On the other hand, the second contact layer 21 may be formed of Mg-doped GaN. The second contact layer 21 may be disposed on the p-type clad layer 19. The second contact layer 21 may be grown at a relatively lower temperature than the p-type clad layer 19. Thus, the step of lowering the substrate temperature may be required. In the step of lowering the substrate temperature or when the second contact layer 21 is being grown, $H_2$ gas is not supplied as the ambient gas, and only $N_2$ gas may be used as the ambient gas. On the other hand, the p-type clad layer 10 may be omitted, and the second contact layer 21 may be directly grown on the active layer 17. In this case, since the growth temperature of the second contact layer 21 is relatively higher than the growth temperature of the active layer 17, it is necessary to raise the substrate temperature after the formation of the active layer 17. At this time, $H_2$ gas is not supplied when the substrate temperature is being raised.

On the other hand, the transparent conductive layer 23, such as ITO or ZnO, may be formed on the second contact layer 21 and come into ohmic contact with the second contact layer 21. The second electrode 27 may be connected to the second contact layer 21 through the transparent conductive layer 23. In addition, the first contact layer 13 may be exposed by removing the second contact layer 21, the p-type clad layer 19, the active layer 17, and a part of the superlattice layer 15 through an etching process. The first electrode 25 may be formed on the exposed first contact layer 13.

Figure 7:
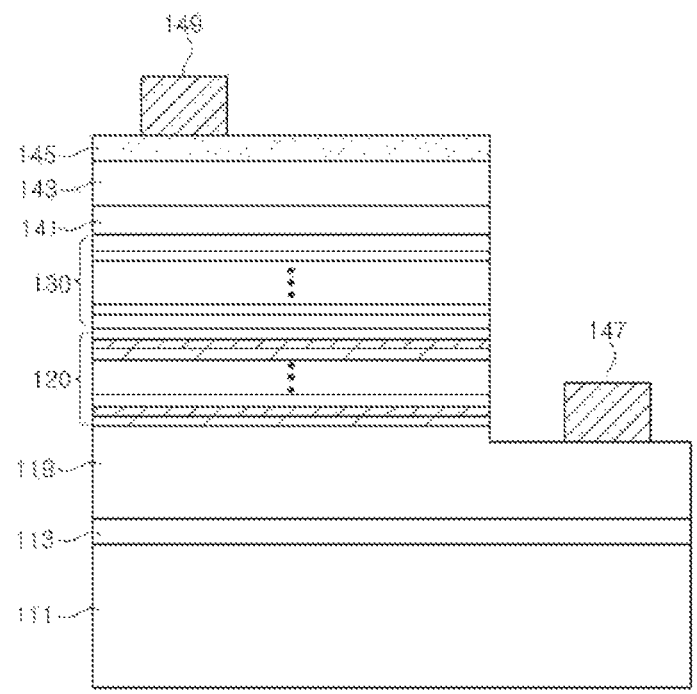
FIG. 7 is a cross-sectional view for describing a light emitting diode according to another embodiment of the present invention.

FIG. 7 is a cross-sectional view for describing a light emitting diode according to another embodiment of the present invention.

Referring to FIG. 7 the light emitting diode includes a gallium nitride substrate 111, an intermediate-temperature buffer layer 13, a first contact layer 119, a superlattice layer 120, an active layer 130, and a second contact layer 143. In addition, the light emitting diode may further include a clad layer 141, a transparent electrode layer 145, a first electrode 147, and a second electrode 149.

The gallium nitride substrate 111 may have an m-plane or a-plane nonpolar growth surface or semipolar growth surface. In addition, the growth surface of the gallium nitride substrate 111 may have a tilt angle for assisting the growth of an epitaxial layer. The gallium nitride substrate 111 may be fabricated using, for example, an HVPE technique.

The intermediate-temperature buffer layer 113 may be formed on the gallium nitride substrate 111. The intermediate-temperature buffer layer 113 may be formed to have a thickness of about 2 to 10 nm in a temperature range of about 700 to 800° C.

Conventionally, technique for forming a low-temperature buffer layer at a temperature below 600° C. has been used for growing a gallium nitride-based epitaxial layer on a sapphire substrate. Due to the low-temperature buffer layer, the gallium nitride-based epitaxial layer can be grown on the sapphire substrate with lattice mismatch and large thermal expansion coefficient difference. However, the gallium nitride substrate 111 is a homogeneous substrate to the gallium nitride epitaxial layer, and the low-temperature buffer layer is not required. Furthermore, in a case where the low-temperature buffer layer is formed on the nonpolar or semipolar gallium nitride substrate 111, the low-temperature buffer layer is formed of an amorphous layer and is then crystallized as the substrate temperature rises. At this time, the low-temperature buffer layer is easily crystallized to have a c-plane growth surface. Therefore, the method of forming the low-temperature buffer layer hardly grows the nonpolar or semipolar gallium nitride-based semiconductor layer with excellent crystal quality on the nonpolar or semipolar gallium nitride substrate.

On the other hand, it may be considered to directly grow a gallium nitride epitaxial layer on the gallium nitride substrate 111 at a high temperature above 900° C. However, in a case where die gallium nitride layer is grown at a high temperature above 900° C., the gallium nitride layer has a very rough surface because the gallium nitride layer tends to be grown to a c-plane. In particular, due to anisotropy of the nonpolar gallium nitride substrate, stripe-shaped patterns are easily formed. In a case where a semiconductor device is fabricated by growing subsequent epitaxial layers on a semiconductor layer with bad surface morphology, a leakage current easily occurs and nonradiative recombination easily occurs. Thus, electrical characteristics and optical characteristics of the semiconductor device are deteriorated.

On the contrary, the epitaxial layer grown on the buffer layer 113 can be made to have a smooth surface by growing the buffer layer 113 at a temperature of 700 to 800° C. and growing the epitaxial layer on the buffer layer 113.

Figure 8:
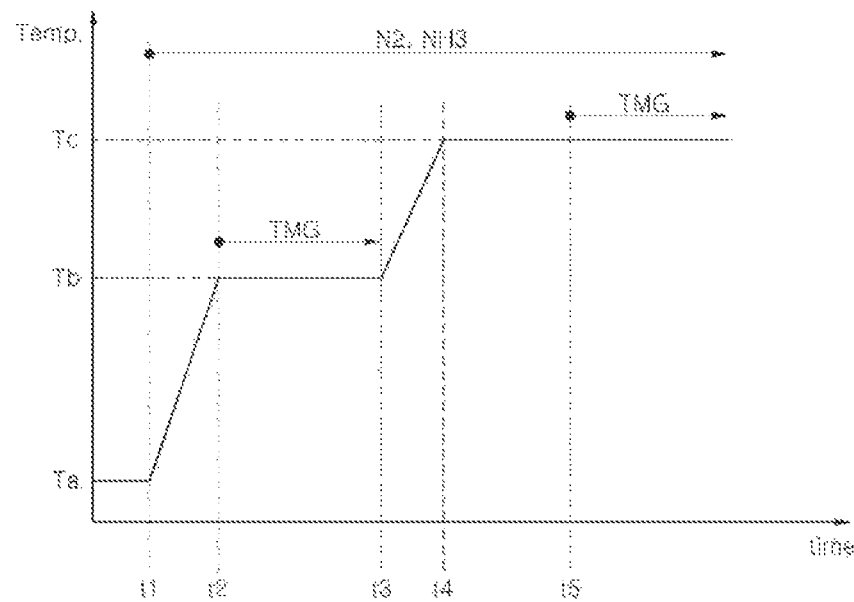
FIG. 8 is a graph for describing a method of growing an intermediate-temperature buffer layer and a semiconductor layer according to another embodiment of the present invention.

As illustrated in FIG. 8, the substrate 111 is loaded into the chamber at room temperature Ta, and the intermediate-temperature buffer layer 113 is grown during a period of time from t2 to t3 after the substrate temperature is raised to the temperature Tb of 700 to 800° C. at a rate of about 100° C./min during the period of time from t1 to t2. At this time, $N_2$ gas and $NH_3$ gas are continuously supplied from the time when the temperature is raised, and TMG being the gallium source is supplied at t2. Therefore, the GaN intermediate-temperature buffer layer 119 is formed during the period of time from t2 to t3.

The n-type contact layer 119 may be formed of Si-doped GaN. The n-type contact layer 110 is grown on the intermediate-temperature buffer layer 113, and the first electrode 147 comes into ohmic contact with the n-type contact layer 119.

As illustrated in FIG. 8, the n-type contact layer 119 is grown at a temperature Tc. The temperature Tc may be above 900° C., for example, 950° C. to 1,050° C., in particular, about 1,000° C. For example, after the intermediate-temperature buffer layer 113 is formed at the temperature Tb, the supply of the gallium source is stopped. The substrate temperature is raised at the rate of about 100° C./min during the period of time from t3 to t4. When the substrate temperature reaches the temperature Tc, the n-type contact layer 119 may be grown by supplying the gallium source again at time t4.

Preferably, after the substrate temperature reaches Tc, the intermediate-temperature buffer layer 113 may be maintained at the temperature Tc for a predetermined time, for example, during a period of time from t4 to t5. For example, the intermediate-temperature buffer layer 113 may be maintained at the temperature Tc for 3 to 10 minutes, preferably, 5 to 10 minutes. Subsequently, the n-type contact layer 110 may be grown by supplying the gallium, source again at time t5. Since the intermediate-temperature buffer layer 113 is maintained at the temperature Tc, the intermediate-temperature buffer layer 113 may be thermally treated and recrystallized. Accordingly, the surface morphology of the n-type contact layer 119 grown on the intermediate-temperature buffer layer 113 can be further improved.

Although the n-type contact layer 110 is illustrated as a single layer, the n-type contact layer 119 is not limited to the single GaN layer. Another gallium nitride-based layer may be interposed in the middle of the n-type contact layer 119.

Figure 9:
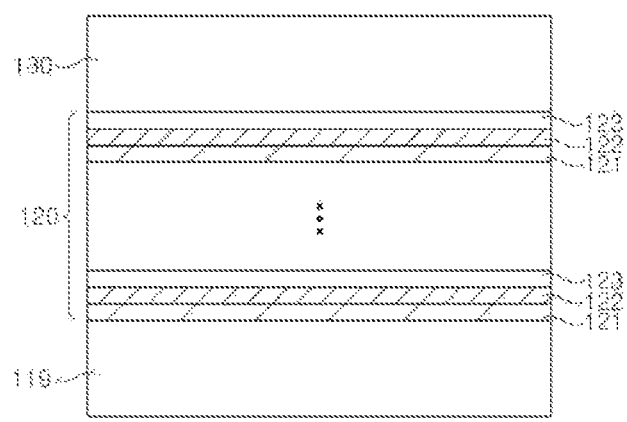
FIGS. 9 and 10 are cross-sectional views for describing a superlattice layer of a light emitting diode according to another embodiment of the present invention.

On the other hand, the superlattice layer 120 with a multi-layered structure is disposed on the n-type contact layer 119. The superlattice layer 120 is disposed between the n-type contact layer 119 and the active layer 130. Accordingly, the superlattice layer 120 is disposed on an electric current path. The superlattice layer 120 may be formed by repetitively laminating a pair of InGaN/GaN at multiple periods (for example, 15 to 20 periods), but is not limited thereto. For example, as illustrated in FIG. 9, the superlattice layer 120 may be configured in such a way that a three-layer structure of InGaN layer 121/AlGaN layer 122/GaN layer 123 is repetitively laminated at multiple periods (for example, 10 to 20 periods). The order of the AlGaN layer 122 and the InGaN layer 121 may be reversed. In this case, the InGaN layer 121 has a wide band gap as compared with the well layer inside the active layer 130. In addition, it is preferable that the AlGaN layer 122 has a wide band gap as compared with the barrier layer inside the active layer 130. Furthermore, the InGaN layer 121 and the AlGaN layer 122 may be formed of an undoped layer into which no impurity is intentionally doped, and the GaN layer 123 may be formed of a Si-doped layer. It is preferable that the uppermost layer of the superlattice layer 120 is an impurity-doped GaN layer 123.

Since the AlGaN layer 122 is included in the superlattice layer 120, holes inside the active layer 130 can be prevented from moving toward the n-type contact layer 119, improving a radiative recombination rate within the active layer 130. The AlGaN layer 122 may be formed to have a thickness less than 1 mm.

Figure 10:
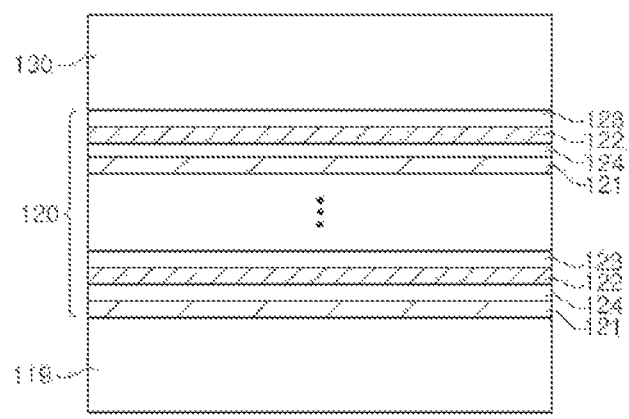

On the other hand, in the superlattice layer 120, since the AlGaN layer 122 is formed on the InGaN layer 121, lattice mismatch, between the InGaN layer 121 and the AlGaN layer 122 is great, and thus, crystal defect is easily formed on an interface therebetween. Therefore, as illustrated in FIG. 10, a GaN layer 124 may be inserted between the InGaN layer 121 and the AlGaN layer 122. The GaN layer 124 may be formed of an undoped layer or a Si-doped layer.

Figure 11:
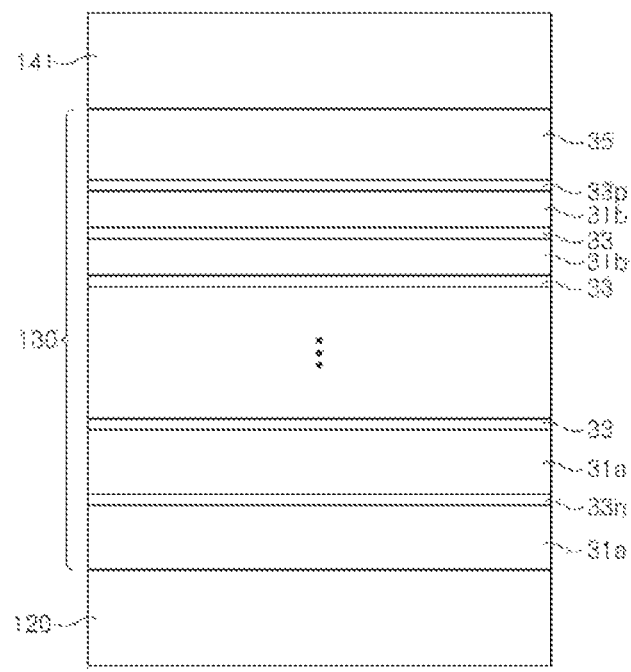
FIG. 11 is a cross-sectional view for describing an active layer according to another embodiment of the present invention.
Figure 12:
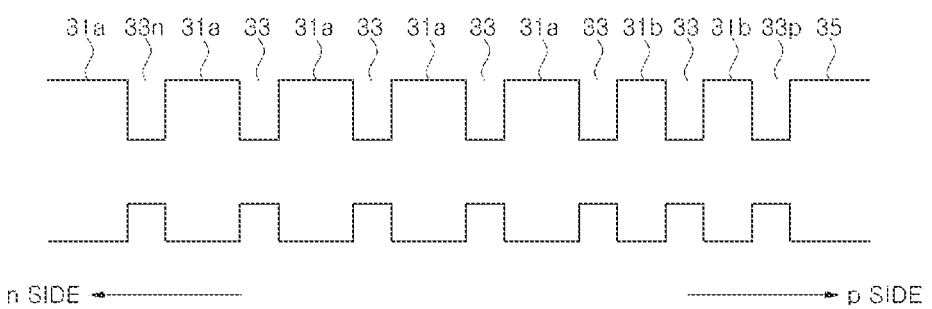
FIG. 12 illustrates an energy band for describing the active layer of FIG. 11.

The active layer 130 with a multiple quantum well structure is disposed on the superlattice layer 120. As illustrated in FIG. 11, the active layer 130 has a structure in which barrier layers 31a and 31b and well layers 33n, 33 and 33p are alternately laminated. The well layer 33n represents a well layer (first well layer) closest to the superlattice layer 120 or the n-type contact layer 119, and the well layer 33p represents a well layer (n-th well layer) closest to the p-type clad layer 141 or the p-type contact layer 123. FIG. 12 illustrates an energy band of the active layer 130.

Referring to FIGS. 11 and 12, (n−1) barrier layers 31a and 31b and (n−2) well layers 33 are alternately laminated between the well layer 33n and the well layer 33p. The barrier layers 31a have a larger thickness than an average thickness of the (n−1) barrier layers 31a and 31b, and the barrier layers 31b have a smaller thickness than the average thickness. In addition, as illustrated in FIGS. 11 and 12, the barrier layers 31a are disposed closer to the first well layer 33n, and the barrier layers 31b are disposed closer to the n-th well layer 33p.

Furthermore, the barrier layer 31a may be disposed in contact with the uppermost layer of the superlattice layer 120. That is, the harrier layer 31a may be disposed between the superlattice layer 120 and the first well layer 33n. In addition, a barrier layer 35 may be disposed on the n-th well layer 33p. The barrier layer 35 may have a relatively larger thickness than the barrier layer 31a.

By relatively reducing the thicknesses of the barrier layers 31b close to the n-th well layer 33p, the resistance component of the active layer 130 can be reduced. In addition, holes injected from the p-type contact layer 143 can be dispersed to the well layers 33 inside the active layer 130. Therefore, the forward voltage of the light emitting diode can be reduced. In addition, by relatively increasing the thickness of the barrier layer 35, crystal defects generated while growing the active layer 130, in particular, the well layers 33m, 33 and 33p are recovered. Therefore, crystal quality of the epitaxial layers formed on the active layer 130 can, be improved. However, in a case where the barrier layers 31b are formed more than the barrier layers 31a, defect density inside the active layer 130 may be increased, and thus, luminous efficiency may be lowered. Therefore, if is preferable that the barrier layers 31a are formed more than the barrier layers 31b.

On the other hand, the well layers 33u, 33 and 33p may have substantially the same thickness. Accordingly, light having a very narrow full width at half maximum can be emitted. On the contrary, light having a relatively wide full width at half maximum can be emitted by differently adjusting the thicknesses of the well layers 33n, 33 and 33p. Furthermore, it is possible to prevent the generation of the crystal defects by relatively reducing the thickness of the well layer 33 disposed between the barrier layers 31b as compared with the well layer 33 disposed between the barrier layers 31a. For example, the thickness of the well layers 33n, 33 and 33p may be within a range from 10 to 30 Å, the thickness of the barrier layers 31a may be within a range from 50 to 70 Å, and the thickness of the barrier layers 31b may be within a range from 30 to 50 Å.

In addition, the well layers 33n, 33 and 33p may be formed of a gallium nitride-based layer which emits near-ultraviolet light, blue light, or green light. For example, the well layers 33n, 33 and 33p may be formed of InGaN, and an In composition ratio is adjusted according to a required wavelength.

On the other hand, the barrier layers 31a and 31b are formed of a gallium nitride-based layer with a wider band gap than the well layers 33n, 33 and 33p so as to confine electrons and holes within the well layers 33n, 33 and 33p. For example, the barrier layers 31a and 31b may be formed of GaN, AlGaN, or AlInGaN. In particular, the barrier layers 31a and 31b may be formed of an Al-containing gallium nitride-based, layer so as to further improve the band gap. In this case, it is preferable that the Al composition ratio within the barrier layers 31a and 31b is in a range from 0 to 0.1, in particular, from 0.02 to 0.05. By limiting the Al composition ratio to the above range, light output can be increased.

In addition, although not illustrated, a capping layer may be formed between the respective well layers 33n, 33 and 33p and the barrier layers 31a and 31b disposed thereon. The capping layer is formed for preventing the damage of the well layers when the temperature of the chamber is being raised so as to grow the barrier layers 31a and 31b. For example, the well layers 33n, 33 and 33p may be grown at a temperature of about 780° C., and the barrier layers 31a and 31b may be grown at a tempera turn of about 800° C.

The p-type clad layer 141 is disposed on the active layer 130, and may be formed of AlGaN. Alternatively, the p-type clad layer 141 may also be formed in a superlattice structure in which InGaN/AlGaN is repetitively laminated. The p-type clad layer 141 is an electron blocking layer and prevents electrons from moving to the p-type contact layer 143, leading to an improvement in luminous efficiency.

Referring again to FIG. 7, the p-type contact layer 143 may be formed of Mg-doped GaN. The p-type contact layer 143 may be disposed on the p-type clad layer 141. On the other hand, the transparent conductive layer 145, such as ITO or ZnO, may be formed on the p-type contact layer 143 and come into ohmic contact with the p-type contact layer 143. The second contact layer 149 is electrically connected to the p-type contact layer 143. The second electrode 149 may be connected to the p-type contact layer 143 through the transparent conductive layer 145.

On the other hand, the n-type contact layer 119 may be exposed by removing the p-type contact layer 143, the p-type clad layer 141, the active layer 130, and a part of the superlattice layer 120 through an etching process. The first electrode 147 may be formed on the exposed n-type contact layer 119.

In this embodiment, the intermediate-temperature buffer layer 113 and the epitaxial layers 19 to 43 grown on the gallium nitride substrate 111 may be formed using an MOCVD technique. At this time, TMAl, TMGa, and TMIn may be used as sources of Al, Ga and In, and $NH_3$ may be used as a source of N. In addition, $SiH_4$ may be used, as a source of Si, which is an n-type impurity, and $Cp_2Mg$ may be used as a source of Mg, which is a p-type impurity.

Experimental Example

Figure 13A:
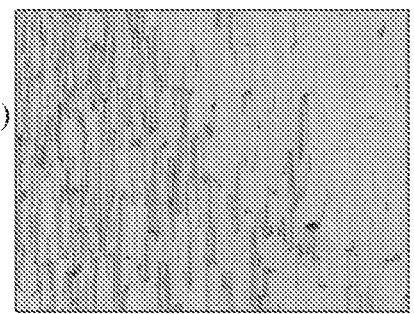
FIGS. 13A to 13C are optical photographs for describing surface morphologies of a gallium nitride layer according to another embodiment of the present invention.
Figure 13B:
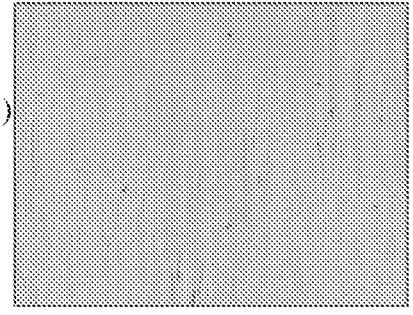
Figure 13C:
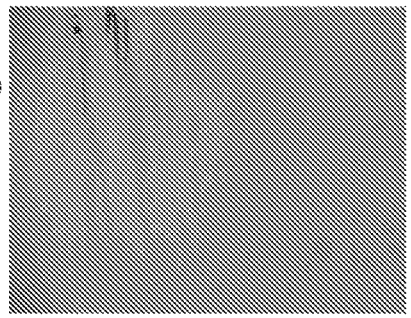

FIGS. 13A to 13G are optical photographs showing surface morphologies of the epitaxial layer according to the use of the intermediate-temperature buffer layer 113. FIG. 13A is a photograph showing the surface of the n-type GaN layer grown, on the gallium nitride substrate 111, without the intermediate-temperature buffer layer 113. FIG. 13B is a photograph showing the surface of the n-type GaN layer immediately grown when the intermediate-temperature buffer layer 113 was formed on the gallium nitride substrate 111, the substrate temperature was raised to the growth temperature of the n-type GaN layer and then reached the growth temperature of the n-type GaN layer. FIG. 13C is a photograph showing the surface of the n-type GaN layer grown when the intermediate-temperature buffer layer 113 was formed on the gallium nitride substrate 111, the substrate temperature was raised to the growth temperature of the n-type GaN layer and then the intermediate-temperature buffer layer was maintained at the growth temperature of the n-type GaN layer for 5 minutes.

A substrate with an m-plane growth surface was used as the gallium nitride substrate 111. The intermediate-temperature buffer layer 113 was formed to have a thickness of about 5 nm at a temperature of about 750° C. when a ratio of $NH_3$ to TMG, that is, a V/III ratio is set to about 357.1. The n-type GaN layers were all grown at 1,000° C. when the V/III ratio was set to about 76.9.

Referring to FIG. 13A, in a case where the n-type GaN layer was directly grown without forming the intermediate-temperature buffer layer 113, it can be seen that the surface of the n-type GaN layer was very rough. Since the crystal orientation of the GaN layer grown on the gallium nitride substrate 111 is locally changed, the epitaxial layer has a rough surface. In addition, the stripe-shaped surface morphology is observed. This is determined as a phenomenon occurring because the gallium nitride substrate 111 has anisotropy.

On the contrary, referring to FIG. 13B, it can be seen that the n-type GaN layer having a smooth surface was formed by the use of the intermediate-temperature buffer layer 113. That is, since the intermediate-temperature buffer layer 113 alleviates the surface defects of the growth substrate 111, the crystal quality of the epitaxial layer formed thereon is improved.

Therefore, it can be seen that the crystal quality of the epitaxial layer grown on the intermediate-temperature buffer layer 113 at a high temperature of 900° C. can be improved by growing the intermediate-temperature buffer layer 113 at a temperature of 700 to 800° C.

Furthermore, referring to FIG. 13C, it can be seen that the surface morphology of the n-type GaN layer is further improved by maintaining the intermediate-temperature buffer layer 113 at the growth temperature of the n-type GaN layer for a predetermined time.

In the foregoing embodiments, the light emitting diode has been described for illustrative purpose, but the present invention is not limited to the light emitting diode. The present invention can also be applied to any type of a semiconductor device adopting a nonpolar or semipolar gallium nitride-based semiconductor layer.

According to the embodiments of the present invention, the nonpolar gallium nitride layer with excellent surface morphology can be grown on the nonpolar gallium nitride substrate. Therefore, the semiconductor layers with excellent crystal quality can be grown on the nonpolar gallium nitride substrate, and the semiconductor devices, such as the light emitting diode with high luminous efficiency, can be fabricated using these semiconductor layers. In addition, by adopting the intermediate-temperature buffer layer, the nonpolar or semipolar gallium, nitride-based semiconductor layers with excellent crystal quality can be grown on the nonpolar or semipolar gallium nitride substrate. The semiconductor devices can be provided using the nonpolar or semipolar gallium nitride-based semiconductor layers grown on the intermediate-temperature buffer layer. In particular, the nonpolar or semipolar light emitting diodes with improved luminous efficiency can be provided.

While the embodiments of the present invention have been described with reference to the specific embodiments, it will be apparent to those skilled in the art that various changes and modifications may be made without departing from the spirit and scope of the invention as defined in the following claims.

What is claimed is:

1. A method of fabricating a nonpolar gallium nitride semiconductor device using metal organic chemical vapor deposition, the method comprising:
    growing an intermediate-temperature buffer layer over a nonpolar gallium nitride substrate at a growth temperature of a range from 700° C. to 800° C.;
    growing a gallium nitride based first semiconductor layer over the intermediate-temperature buffer layer at a growth temperature above 900° C., wherein the first semiconductor layer is n-typed semiconductor layer;
    forming an active layer over the first semiconductor layer; and
    forming a second semiconductor layer over the active layer, wherein the second semiconductor layer is p-typed semiconductor layer;
    wherein the active layer includes a structure in which barrier layers and well layers are alternately laminated,
    wherein the barrier layers include a plurality of first barrier layers each having a first thickness, a plurality of second barrier layers formed over the plurality of first barrier layers and having a second thickness, and a third barrier layer formed over the second barrier layers and having a third thickness, wherein the plurality of first barrier layers, the plurality of second barrier layers, and the third barrier layer are sequentially arranged along a direction from the first semiconductor layer to the second semiconductor layer such that the plurality of the first barrier layers are followed by the plurality of second barrier layers and the third barrier layer, and
    wherein the third barrier layer is closer to the second semiconductor layer than the first barrier layer and the second barrier layer are and the third thickness is greater than the first thickness.

2. The method of claim 1, wherein the nonpolar gallium nitride substrate has an m-plane growth surface, and the intermediate-temperature buffer layer is grown on the m-plane growth surface.

3. The method of claim 2, wherein the intermediate-temperature buffer layer includes a GaN layer.

4. The method of claim 1, wherein the nonpolar gallium nitride semiconductor device includes a nonpolar light emitting diode.

5. The method of claim 1, further including:
    forming a superlattice layer with a multi-layered structure between the first semiconductor layer and the active layer.

6. The method of claim 1, wherein the first barrier layer has a greater thickness than an average thickness of the barrier layers.

7. The method of claim 6, wherein the first barrier layer is disposed at a bottommost position in the structure of the active layer.

8. The method of claim 6, wherein the thickness of the first barrier layer includes a thickness from 50 Å to 70 Å.

9. The method of claim 6, wherein the third barrier layer is disposed at a topmost position in the structure of the active layer.

10. The method of claim 1, wherein the second barrier layer has a smaller thickness than an average thickness of the barrier layers.

11. The method of claim 10, wherein the second barrier layer is disposed between a topmost position in the structure of the active layer and a bottommost position in the structure of the active layer.

12. The method of claim 10, wherein the thickness of the second barrier layer includes a thickness from 30 Å to 50 Å.

13. The method of claim 1, wherein the well layers have substantially the same thickness.

14. The method of claim 1, wherein the first thickness is greater than the second thickness.

15. A method of fabricating a nonpolar gallium nitride semiconductor device using metal organic chemical vapor deposition, the method comprising:
    providing a gallium nitride substrate;
    growing an intermediate-temperature buffer layer over the gallium nitride substrate in a first temperature range higher than 600° C.;
    growing an n-type contact layer over the intermediate-temperature buffer layer in a second temperature range higher than the first temperature range; and
    growing an active layer over the n-type contact layer to have a structure in which barrier layers and well layers are alternately laminated, and
    wherein the barrier layers include a first plurality of barrier layers each having a first thickness, a second plurality of barrier layers formed over the first plurality of barrier layers and having a second thickness, and a third barrier layer formed over the second plurality of barrier layers and having a third thickness greater than the second thickness, wherein the first plurality of barrier layers, the second plurality of barrier layers, and the third barrier layer sequentially arranged along a direction away from the n-type contact layer such that the first plurality of barrier layers are followed by the second plurality of barrier layers and the third barrier layer, and
    wherein the third barrier layer is furthest away from the n-type contact layer as compared to the first plurality of barrier layers and the second plurality of barrier layers.

16. The method of claim 15, wherein the first temperature range is from 700° C. to 800° C. and the second temperature range is above 900° C.

17. The method of claim 15, wherein the first thickness is greater than the second thickness.

18. The method of claim 15, wherein the first thickness is smaller than the third thickness.

19. The method of claim 15, further comprising: after the growing of the n-type contact layer and before the growing of the active layer, growing a superlattice layer over the n-type contact layer.

20. A method of fabricating a nonpolar gallium nitride semiconductor device using metal organic chemical vapor deposition, the method comprising:
    providing a gallium nitride substrate;
    growing an intermediate-temperature buffer layer over the gallium nitride substrate in a first temperature range higher than 600° C.;
    growing an n-type contact layer over the intermediate-temperature buffer layer in a second temperature range higher than the first temperature range; and growing an active layer over the n-type contact layer to have a structure in which barrier layers and well layers are alternately laminated, and
    wherein the barrier layer includes a first plurality of barrier layers each having a first thickness, a second plurality of barrier layers formed over the first plurality of barrier layers and having a second thickness, and a third barrier layer formed over the second plurality of barrier layers and wherein the first plurality of barrier layers includes more barrier layers than the second plurality of barrier layers.

21. A method of fabricating a nonpolar gallium nitride semiconductor device using metal organic chemical vapor deposition, the method comprising:
    providing a gallium nitride substrate;
    growing an intermediate-temperature buffer layer over the gallium nitride substrate in a first temperature range higher than 600° C.;
    growing an n-type contact layer over the intermediate-temperature buffer layer in a second temperature range higher than the first temperature range; and growing an active layer over the n-type contact layer to have a structure in which barrier layers and well layers are alternately laminated, and
    wherein the barrier layer includes a first plurality of barrier layers each having a first thickness, a second plurality of barrier layers formed over the first plurality of barrier layers and having a second thickness, and a third barrier layer formed over the second barrier layers and wherein the first plurality of barrier layers includes more barrier layers than the second plurality of barrier layers.

* * * * *